(12) United States Patent
Walther et al.

(10) Patent No.: US 6,521,895 B1
(45) Date of Patent: Feb. 18, 2003

(54) WIDE DYNAMIC RANGE ION BEAM SCANNERS

(75) Inventors: Steven R. Walther, Andover; Nicholas R. White, Wenham, both of MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 09/425,123

(22) Filed: Oct. 22, 1999

(51) Int. Cl.⁷ .............. G21K 1/08; H01J 3/14; H01J 3/26; H01J 49/42
(52) U.S. Cl. .............. 250/396 R; 250/492.2; 250/298
(58) Field of Search .............. 250/396 R, 298, 250/396 ML, 492.2

(56) References Cited

U.S. PATENT DOCUMENTS

| | | | |
|---|---|---|---|
| 3,688,203 A | * 8/1972 | Harrison | 328/229 |
| 4,063,103 A | 12/1977 | Sumi | 250/492 A |
| 4,367,411 A | 1/1983 | Hanley et al. | 250/492.2 |
| 4,587,432 A | 5/1986 | Aitken | 250/492.2 |
| 4,745,281 A | 5/1988 | Enge | 250/356 R |
| 4,751,393 A | 6/1988 | Corey, Jr. et al. | 250/492.21 |
| 4,922,106 A | 5/1990 | Berrian et al. | 250/492.2 |
| 4,942,342 A | 7/1990 | Tsukakoshi | 315/410 |
| 5,907,158 A | 5/1999 | Nasser-Ghodsi et al. | 250/492.21 |

FOREIGN PATENT DOCUMENTS

| | | |
|---|---|---|
| JP | 63 002239 | 1/1988 |
| JP | 03 089440 | 4/1991 |

OTHER PUBLICATIONS

JP 2000–150367, Koji et al., "Charged beam Drawer", abstract.*

* cited by examiner

*Primary Examiner*—Jack Berman
*Assistant Examiner*—Kalimah Fernandez
(74) *Attorney, Agent, or Firm*—Wolf, Greenfield & Sacks, P.C.

(57) ABSTRACT

Methods and apparatus are provided for scanning a charged particle beam. The apparatus includes scan elements and a scan signal generator for generating scan signals for scanning the charged particle beam in a scan pattern having a scan origin. In one embodiment, the apparatus includes a position controller for positioning the scan elements based on a parameter of the charged particle beam, such as energy. The scan elements may be positioned to achieve a fixed position of the scan origin for different beam energies. In another embodiment, the apparatus includes first and second sets of scan elements and a scan signal controller for controlling the scan signals supplied to the sets of scan elements based on a parameter of the charged particle beam, such as energy. The scan signal controller may control the ratio of the scan signals applied to the sets of scan elements, or may deenergize a set of scan elements, to minimize space charge forces on the charged particle beam that may reduce beam transmission through the apparatus.

40 Claims, 8 Drawing Sheets

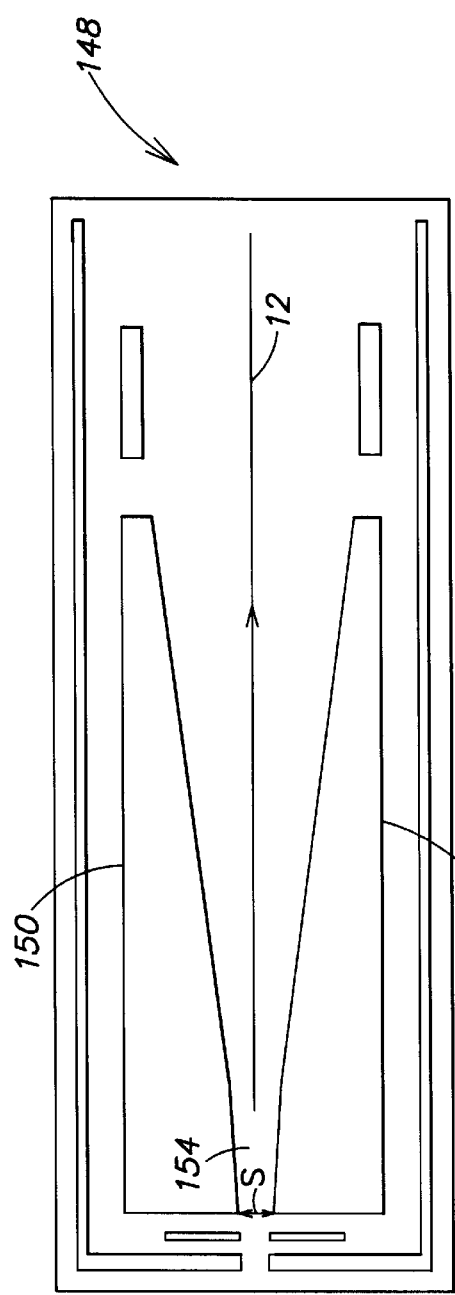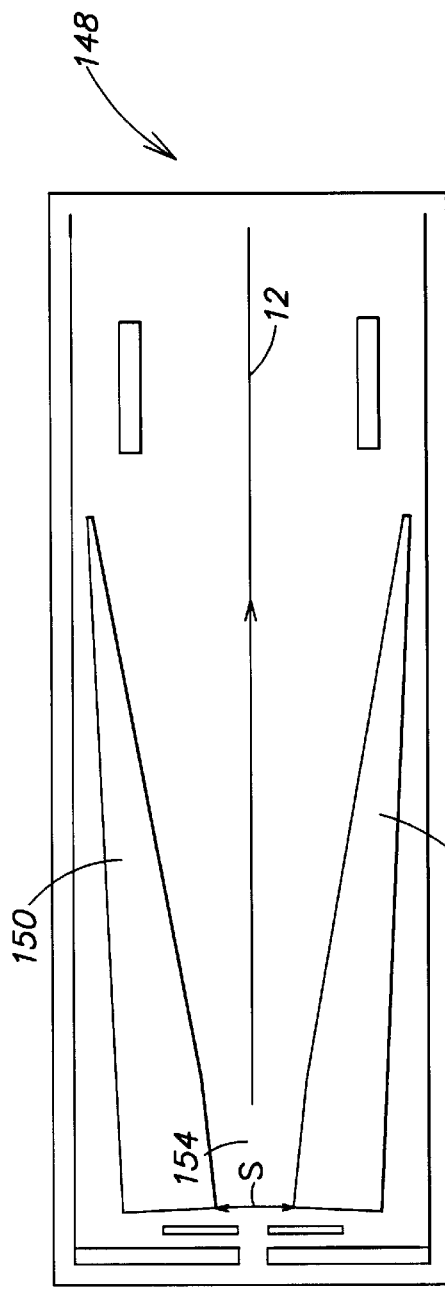

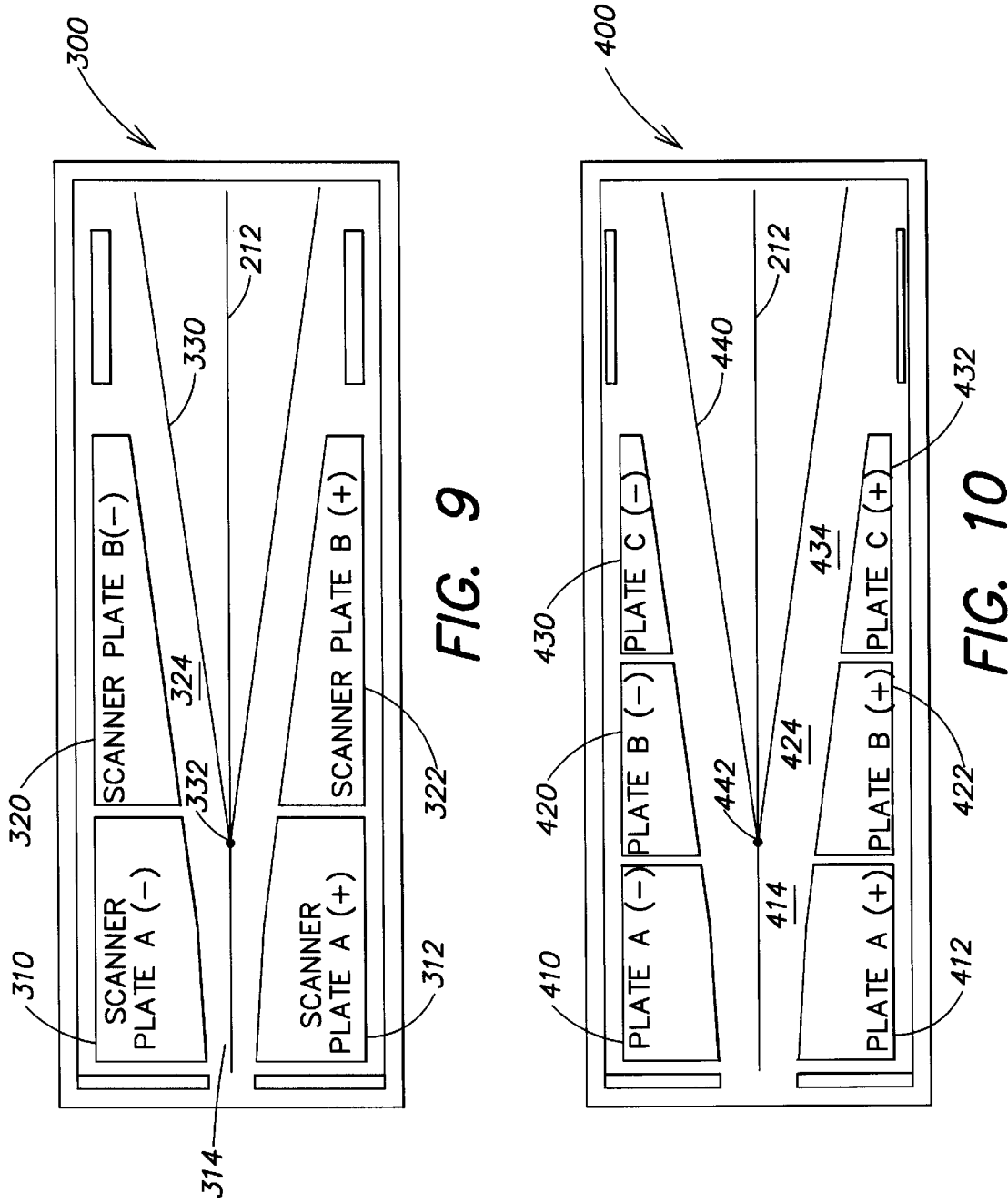

WIDE DYNAMIC RANGE ION BEAM SCANNERS

FIELD OF THE INVENTION

This invention relates to methods and apparatus for scanning a charged particle beam, such as an ion beam, and, more particularly, to scanners which operate over a wide range of charged particle beam energies. The invention is particularly useful in ion implanters, but is not limited to such use.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy, and the ion beam is directed at the surface of a wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or by a combination of beam scanning and target movement.

The ion implanter may include an electrostatic or magnetic scanner for deflecting the ion beam over the surface of the wafer being implanted. The scanner may deflect the ion beam in one dimension or in two dimensions, depending on the design of the system. Both electrostatic and magnetic scanners are well known to those skilled in the art.

An electrostatic scanner includes one or more sets of scan plates. The scan plates of each set are spaced apart to define a gap, and the ion beam is directed through the gap. A scan voltage, which may have a sawtooth waveform, is applied to the scan plates. The scan voltage produces between the scan plates an electric field which deflects the ion beam in accordance with the scan voltage waveform. Electrostatic scanners are disclosed in U.S. Pat. No. 4,922,106 issued May 1, 1990 to Berrian et al and U.S. Pat. No. 4,751,393 issued Jun. 14, 1988 to Corey, Jr. et al.

Magnetic scanners typically include magnetic polepieces and a coil, which constitute an electromagnet. The magnetic polepieces are spaced apart to define a gap, and the ion beam is directed through the gap. A scan current applied to the coil produces in the gap a magnetic field which deflects the ion beam. By varying the current supplied to the coil in accordance with a desired scan waveform, the beam is scanned magnetically. A magnetic scanner is disclosed in U.S. Pat. No. 4,367,411 issued Jan. 4, 1983 to Hanley et al.

Prior art beam scanners have had fixed scan plates or fixed electromagnets for operation over a prescribed range of beam energies. In electrostatic scanners, the scan plate spacing is selected to produce the desired deflection at the maximum beam energy. At low beam energies, the beam expands due to space charge effects, and only part of the beam passes between the scan plates. As a result, the beam current delivered to the wafer is reduced, and implant times are increased, often to an unacceptable extent. In some cases, the beam current is reduced to a negligible level, and the implant cannot be performed. Prior art electrostatic scanners which utilize fixed scan plates typically operate over a range of approximately one order of magnitude in energy, for example, 40 keV to 400 keV.

The implanted depths of the dopant material is determined, at least in part, by the energy of the ions implanted into the semiconductor wafer. In accordance with the trend in the semiconductor industry toward smaller, higher speed devices, both the lateral dimensions and the depths of features in semiconductor devices are decreasing. State of the art semiconductor devices require junction depths less than 1000 angstroms and may eventually require junction depths on the order of 200 angstroms or less. Very low implant energies, on the order of 1–10 keV, are required to achieve such shallow junctions. At the opposite end of the energy range, high energies, on the order of 1 MeV or greater, are required for device features such as electrical isolation from the silicon substrate. Thus, a wide range of implant energies is required.

It is desirable to provide ion implanters which can operate over a wide range of ion energies, so that one implanter may be utilized for all or most implants in a semiconductor process. However, prior art beam scanners have not been capable of operation over a wide range of energies for the reasons discussed above. At low energies, beam transmission may be unacceptably low, and at high energies, beam deflection may be insufficient. Accordingly, there is a need for improved beam scanners that operate over a wide range of beam energies with high beam transmission and with the required beam deflection.

SUMMARY OF THE INVENTION

According to a first aspect of the invention, apparatus is provided for scanning a charged particle beam. The apparatus comprises scan elements spaced apart by a gap for passing a charged particle beam, a scan signal generator coupled to the scan elements for generating scan signals for scanning the charged particle beam in a scan pattern having a scan origin, and a position controller for positioning the scan elements based on at least one parameter of the charged particle beam. For example, the scan elements may be positioned based on the energy of the charged particle beam.

In one embodiment, the scan elements comprise electrostatic scan plates for electrostatic deflection of the charged particle beam, and the scan signal generator comprises a scan voltage generator. In another embodiment, the scan elements comprise magnetic polepieces and a magnetic coil for energizing the magnetic polepieces, and the scan signal generator comprises a scan current generator for energizing the magnetic coil.

The position controller may comprise means for positioning the scan elements to achieve a desired position of the scan origin for given parameter values of the charged particle beam. The scan elements may be positioned to achieve a fixed position of the scan origin for different parameter values, such as different energies, of the charged particle beam. Where the scan elements are electrostatic scan plates, a fixed position of the scan origin may be achieved by moving the scan plates upstream with respect to the charged particle beam as the spacing between the scan plates is increased. In particular, the scan plates may be translated along linear paths disposed at equal and opposite angles with respect to an axis of the charged particle beam. In another approach, the scan plates may be rotated as the spacing between the scan plates is changed. The scan plates may have a continuous range of positions or may have two or more discrete positions.

According to another aspect of the invention, apparatus is provided for scanning a charged particle beam. The apparatus comprises first scan elements spaced apart by a first gap for passing a charged particle beam, second scan elements spaced apart by a second gap for passing the charged particle beam, a scan signal generator coupled to the first scan elements and the second scan elements for generating scan signals for scanning the charged particle beam in a scan pattern having a scan origin, and a scan signal controller for controlling the scan signals supplied from the scan signal generator to the first scan elements and the second scan elements based on at least one parameter of the charged particle beam. For example, the scan signals may be controlled based on the energy of the charged particle beam.

In one embodiment, the first scan elements and the second scan elements each comprise scan plates for electrostatic deflection of the charged particle beam, and the scan signal generator comprises a scan voltage generator. In another embodiment, the first scan elements and the second scan elements each comprise magnetic polepieces and a magnetic coil for energizing the magnetic polepieces, and the scan signal generator comprises a scan current generator for energizing the magnetic coil.

The scan signal controller may comprise means for controlling the scan signals supplied to the first scan elements and the second scan elements to achieve a desired position of the scan origin for given parameter values of the charged particle beam. In one configuration, the scan signals supplied to the first and second scan elements are controlled to achieved a fixed position of the scan origin for different parameter values, such as different energies, of the charged particle beam. In another configuration, the scan signals supplied to the first and second scan elements are controlled to change the effective length of the first and second scan elements. The scan signal controller may adjust the ratio of the scan signals supplied to the first scan elements and the second scan elements.

According to a further aspect of the invention, a method is provided for scanning a charged particle beam. The method comprises the steps of directing a charged particle beam between spaced-apart scan elements, energizing the scan elements for scanning the charged particle beam in a scan pattern having a scan origin, and controlling positions of the scan elements based on at least one parameter of the charged particle beam.

According to yet another aspect of the invention, a method is provided for scanning a charged particle beam. The method comprises the steps of directing a charged particle beam between spaced-apart first scan elements and spaced-apart second scan elements, applying scan signals to the first scan elements and the second scan elements for scanning the charged particle beam in a scan pattern having a scan origin, and controlling the scan signals supplied to the first scan elements and the second scan elements based on at least one parameter of the charged particle beam.

According to yet another aspect of the invention, apparatus is provided for scanning an ion beam. The apparatus comprises two or more pairs of scan plates for scanning the ion beam and a scan generator for applying scan voltages to the two or more pairs of scan plates for scanning a high energy beam and for applying scan voltages to a subset of the two or more sets of scan plates for scanning a low energy beam. Unused scan plates are electrically grounded. An effective length over which electrical fields are applied to the ion beam is reduced for scanning a low energy beam.

BRIEF DESCRIPTION OF THE DRAWINGS

For a better understanding of the present invention, reference is made to the accompanying drawings, which are incorporated herein by reference and in which:

FIG. 5 illustrates a second example of electrostatic scan plate geometry for use in the apparatus of FIG. 1, with the scan plates positioned for scanning a high energy ion beam;

FIG. 6 illustrates the scan plate geometry of FIG. 5, with the scan plates positioned for scanning a low energy ion beam;

FIG. 9 illustrates a first example of scan plate geometry for the apparatus of FIG. 8; and FIG. 10 illustrates a second example of scan plate geometry for the apparatus of FIG. 8.

DETAILED DESCRIPTION

Figure 1:
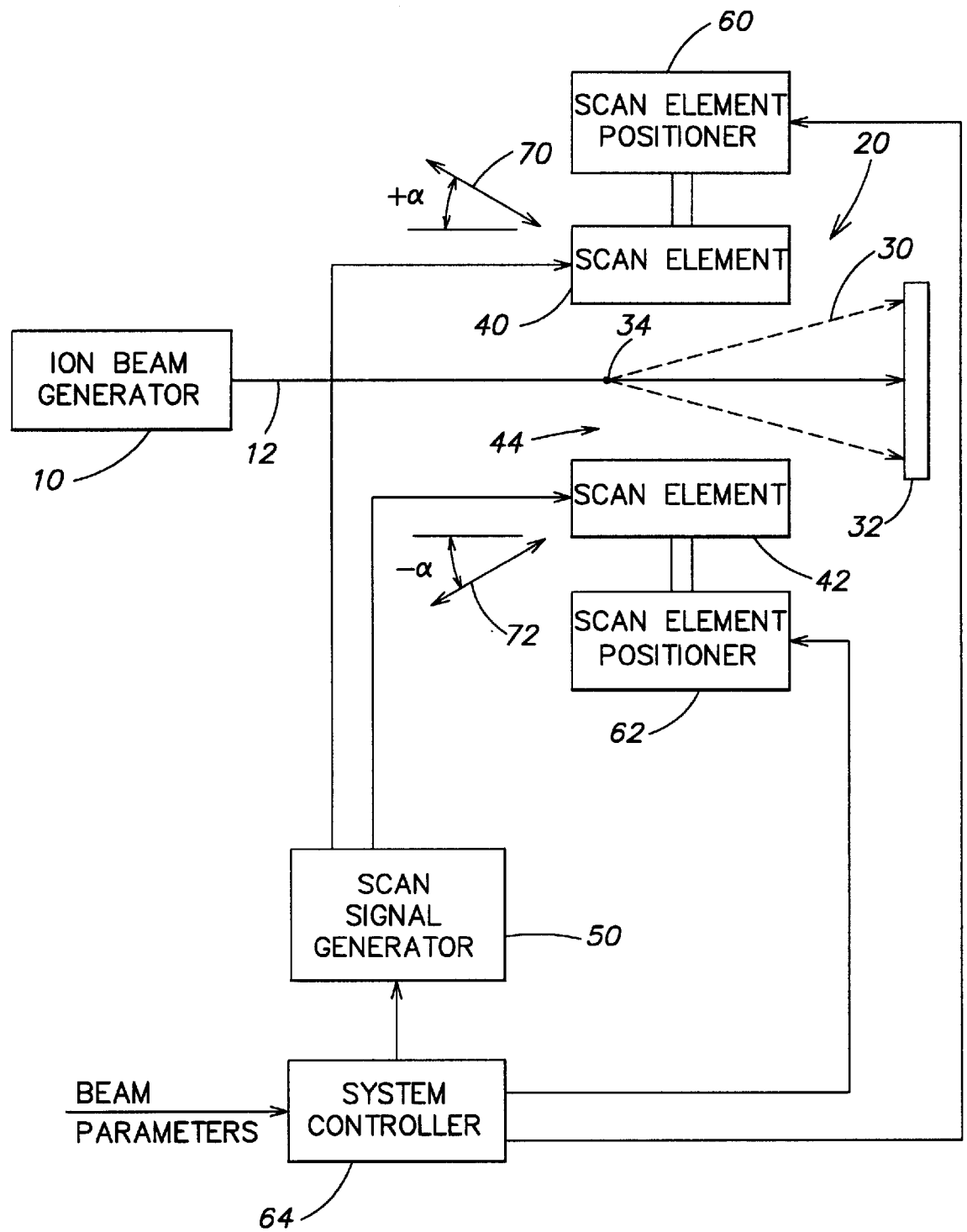
FIG. 1 is a block diagram of beam scanning apparatus in accordance with a first embodiment of the invention.

A simplified block diagram of an ion beam system in accordance with a first embodiment of the invention is shown in FIG. 1. An ion beam generator 10 generates an ion beam of a desired species, accelerates ions in the ion beam to desired energies, performs mass/energy analysis of the ion beam to remove energy and mass contaminants and supplies an energetic ion beam 12. A scanner 20 deflects the ion beam 12 to produce a scanned ion beam having a fan-shaped beam envelope 30 with a scan origin 34. Scanner 20 is part of a beam scanning apparatus as described below. A semiconductor wafer 32 or other workpiece is positioned in the path of the scanned ion beam, such that ions of the desired species are implanted into semiconductor wafer 32. An angle corrector (not shown) may be utilized to direct the ions in the scanned ion beam along parallel trajectories.

The ion beam system shown in FIG. 1 may represent an ion implanter. The ion implanter may include additional components well known to those skilled in the art. For example, semiconductor wafer 32 is typically supported in an end station which includes automated wafer handling equipment, a dose measuring system, an electron flood gun, etc. Ion beam generator 10 may include an ion source, a beam accelerator and a mass analyzer. It will be understood that the entire path traversed by the ion beam is evacuated during ion implantation.

Scanner 20 includes a first scan element 40 and a second scan element 42. Scan elements 40 and 42 are spaced apart and define a gap 44 through which ion beam 12 is directed. In one embodiment, scanner 20 is an electrostatic scanner, and scan elements 40 and 42 are electrostatic scan plates. The ion beam 12 passes through gap 44 between the electrostatic scan plates and is deflected by electric fields in gap 44. In the case of electrostatic scanning, the ion beam 12 is deflected in the direction of the electric field between the scan plates. Thus, horizontally-spaced scan plates are utilized to perform horizontal beam scanning.

In another embodiment, scanner 20 is a magnetic scanner, typically implemented as an electromagnet. The electromagnet includes magnetic polepieces, which correspond to the scan elements 40 and 42, and a magnet coil for energizing the magnetic polepieces. The ion beam 12 passes through gap 44 between the magnetic polepieces and is deflected by magnetic fields in gap 44. In the case of magnetic scanning, the ion beam is deflected perpendicular to the direction of the magnetic field between the magnetic polepieces. Thus, vertically-spaced magnetic polepieces are utilized to perform horizontal beam scanning.

The beam scanning apparatus of FIG. 1 further includes a scan signal generator 50 which provides scan signals to scan elements 40 and 42. In the case of an electrostatic scanner, scan signal generator 50 supplies scan voltages to the scan plates. The scan voltages, which may comprise sawtooth waveforms, produce electric fields between scan elements 40 and 42 for scanning the ion beam. In the case of a magnetic scanner, scan signal generator 50 supplies a scan current to the magnet coil of the electromagnet that constitutes the magnetic scanner. The scan signal generator 50 is controlled by a system controller 64 in response to user-selected beam parameters and other implant parameters.

The beam scanning apparatus of FIG. 1 further includes a scan element positioner 60 for positioning scan element 40 and a scan element positioner 62 for positioning scan element 42. Scan element positioners 60 and 62 may each include a mechanical drive system, such as a motor and a mechanical coupling between the motor and the scan element, for controlling the positions of scan elements 40 and 42. Scan element positioners 60 and 62 are controlled by system controller 64 in response to user-selected beam parameters, such as ion beam energy and ion beam species. As described below, scan element positioners 60 and 62 adjust the spacing between scan elements 40 and 42, may move scan elements 40 and 42 axially with respect to ion beam 12 toward or away from ion beam generator 10, may rotate scan elements 40 and 42, or may provide combinations of these movements under the control of system controller 64. The scan element positioners 60 and 62 may establish a continuous range of positions of scan elements 40 and 42 or may establish two or more discrete positions of scan elements 40 and 42.

In one embodiment, scan elements 40 and 42 are moved along paths 70 and 72, respectively, which are inclined at angles +α and −α, respectively, with respect to ion beam 12. In particular, as the spacing between scan elements 40 and 42 is increased, scan elements 40 and 42 are moved upstream with respect to ion beam 12 toward ion beam generator 10. As described below, paths 70 and 72 may be selected to ensure that scan origin 34 remains in a fixed position as scan elements 40 and 42 are moved.

A first example of an electrostatic scanner for use in the ion beam apparatus of FIG. 1 is described with reference to FIGS. 2 and 3. An electrostatic scanner 100 includes scan plates 110 and 112 spaced apart by a gap 114. Scan plates 110 and 112 correspond to scan elements 40 and 42 in FIG. 1. Scan plates 110 and 112 may include upstream plate portions 110*a* and 112*a*, which may have a spacing S that is constant or slightly diverging in the downstream direction, and diverging downstream plate portions 110*b* and 112*b*. The scan plates are shaped and positioned to provide electric fields suitable for scanning ion beam 12. A fan-shaped beam envelope 116 of the scanned ion beam increases in width in the downstream direction through scan plates 110 and 112. Typically the divergence of scan plates 110 and 112 corresponds to the shape of beam envelope 116.

Scan plates 110 and 112 deflect ion beam 12 in one dimension. In some cases, a complete scanner may include a second set of scan plates for deflecting the ion beam 12 in a second dimension to cover the entire surface of wafer 32. In other cases, scanning in the second dimension is achieved by mechanical movement of wafer 32.

Scan plates 110 and 112 are connected to scan element positioners 60 and 62, respectively, and to scan signal generator 50 as shown in FIG. 1. The scan signal generator 50 applies scan voltages to scan plates 110 and 112 for deflecting ion beam 12. The scan voltages may have different amplitudes, frequencies and waveforms. Although a sawtooth scan waveform is typically utilized, the waveform may be modified to adjust the uniformity of the ion dose applied to the semiconductor wafer. The amplitude of the scan voltage depends on the ion species and energy, as well as the length and spacing of scan plates 110 and 112. By way of example only, the frequency of the scan voltage waveform may be on the order of 1 KHz.

In accordance with an aspect of the invention, the spacing S between scan plates 110 and 112 may be adjusted as a function of one or more ion beam parameters, such as ion beam energy. FIG. 2 illustrates a case of relatively high ion beam energy. For high ion beam energy, an intense electric field is required to deflect the ion beam. Therefore, the scan voltage amplitudes must be relatively high and the spacing S between scan plates 110 and 112 must be relatively small to achieve an intense electric field in the region between scan plates 110 and 112. For low ion beam energies, the amplitudes of the scan voltages applied to scan plates 110 and 112 may be reduced. However, as noted above, low energy ion beams tend to expand due to the space charge effect, and a significant fraction of the ion beam may not pass between scan plates 110 and 112 having a small spacing S. As a result, the ion beam current delivered to the wafer is significantly reduced. This causes implant times to be increased and throughput to be reduced. The scanner is conventionally characterized by a beam acceptance, which represents the fraction of the ion beam that passes through the scanner for given ion beam and scanner parameters. As shown in FIG. 3, reduced beam acceptance at low energies may be overcome, at least in part, by increasing the spacing S between scan plates 110 and 112. The scan voltages are adjusted to provide the desired bam deflection at the selected spacing between scan plates 110 and 112.

Beam envelope 116 is characterized by a scan origin 120. Scan origin 120 is a point where the ion trajectories in beam envelope 116 intersect. As the spacing S between scan plates 110 and 112 is adjusted to accommodate different ion beam parameters, the scan origin 120 moves along the axis of ion beam 12. As shown in FIGS. 2 and 3, scan origin 120 moves downstream away from ion beam generator 110 by a distance 122 as the spacing between scan plates 110 and 112 is increased by moving the scan plates perpendicular to ion beam 12. The shift in scan origin 120 may create problems in certain ion implanter configurations. For example, ion implanters typically utilize an angle corrector positioned downstream of the scanner. The angle corrector converts the diverging ion trajectories produced by the scanner into parallel ion trajectories for incidence on semiconductor wafer 32. The angle corrector is designed and positioned based on a particular location of the scan origin. When the scan origin shifts, the ion trajectories output by the angle corrector may no longer be parallel.

In accordance with a further aspect of the invention, the movement of scan plates 110 and 112 may include both a lateral component and an axial component. The lateral component is perpendicular to ion beam 12 and the axial component is parallel to ion beam 12. In particular, scan plates 110 and 112 may be moved upstream with respect to ion beam 12 as the spacing between scan plates 110 and 112 is increased, along paths 70 and 72. As shown in FIG. 1, paths 70 and 72 are oriented at angles of +α and −α, respectively, with respect to the axis of ion beam 12. The lateral component of scan plate movement, which produces a change in spacing S, is selected to provide a desired beam deflection and beam acceptance. The axial component of scan plate movement is selected to provide a desired position of scan origin 120. In a preferred embodiment, the axial movement is selected to maintain scan origin 120 of the beam envelope 116 in a fixed position as the spacing S between scan plates is varied.

Figure 2:
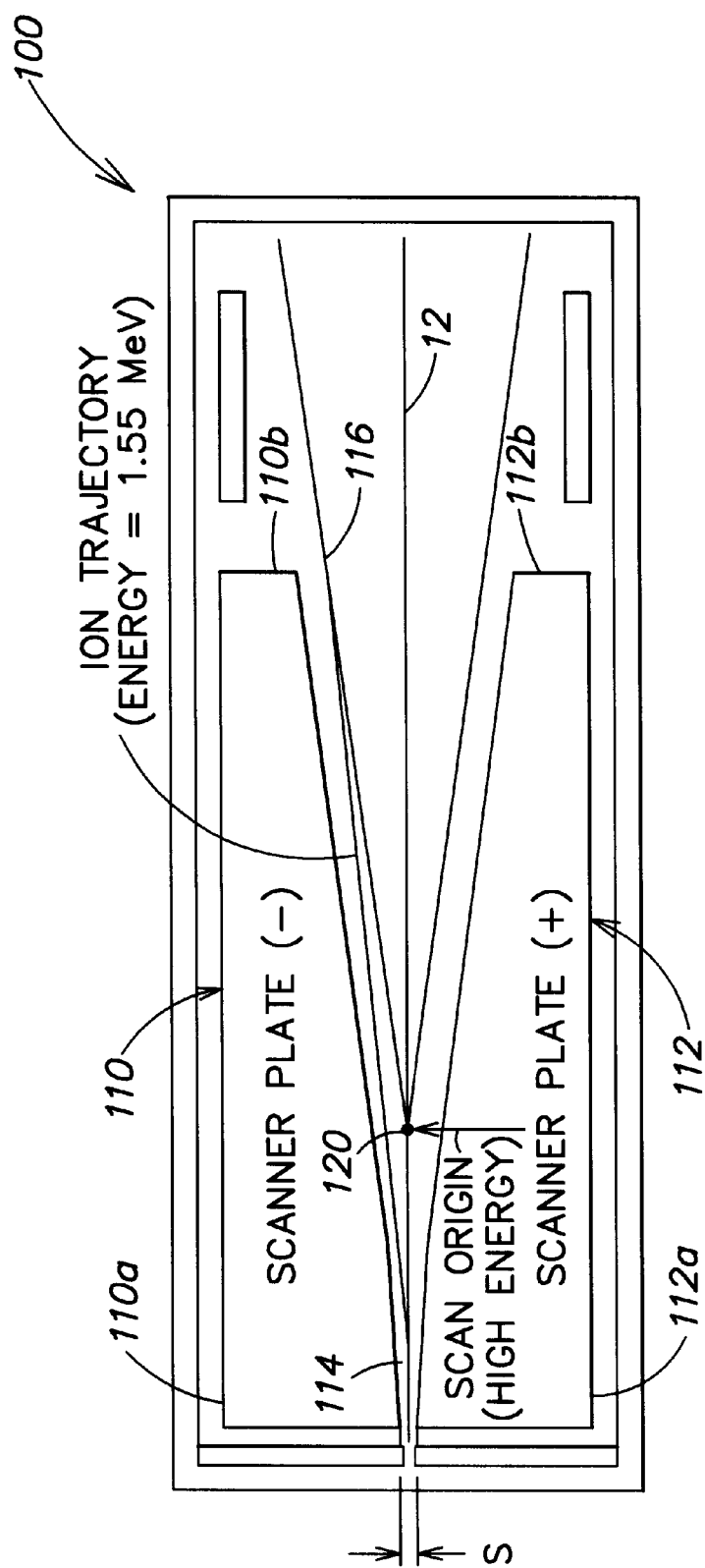
FIG. 2 illustrates a first example of electrostatic scan plate geometry for use in the apparatus of FIG. 1, with the scan plates positioned for scanning a high energy ion beam.
Figure 3:
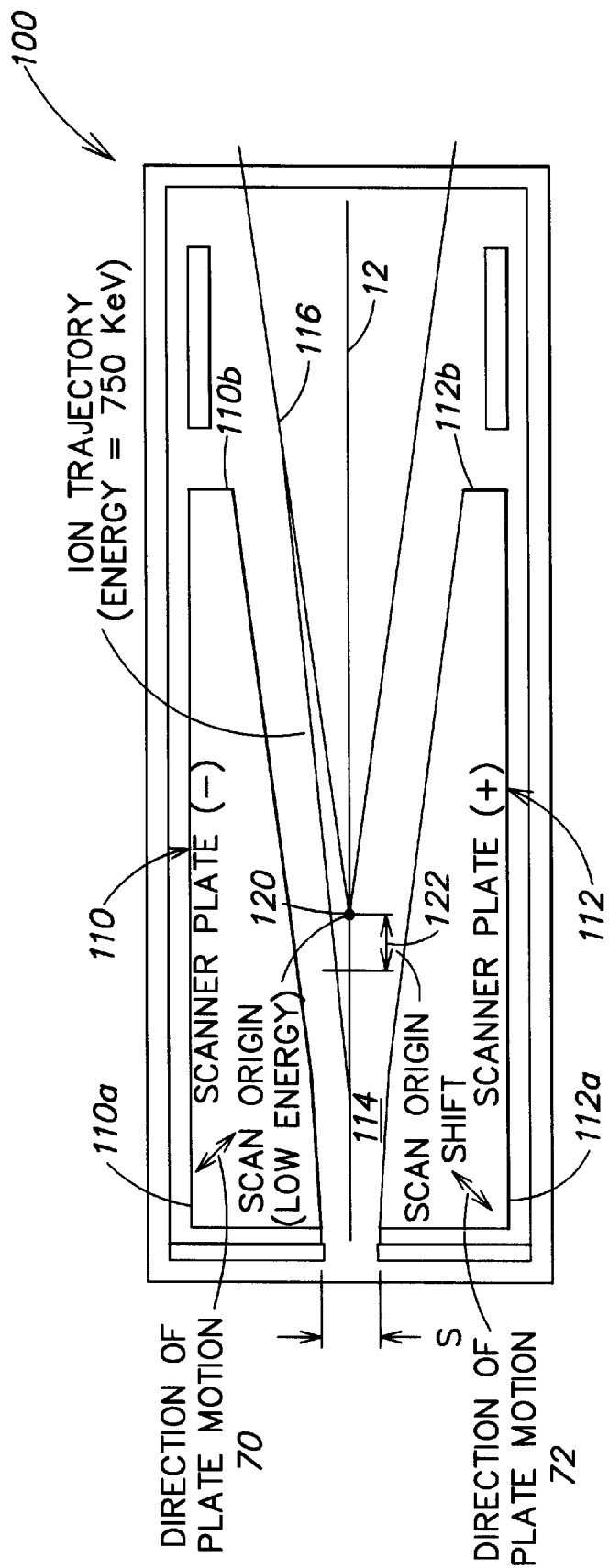
FIG. 3 illustrates the scan plate geometry of FIG. 2, with the scan plates positioned for scanning a low energy ion beam.

By way of example, the configuration of FIG. 2 may utilize a spacing S between scan plates 110 and 112 of 12 millimeters (mm) for an ion beam having an energy of 1.55 MeV. The configuration of FIG. 3 may utilize a spacing S between scan plates 110 and 112 of 40 mm for a beam energy of 750 keV. In this example, scan origin 120 shifts along ion beam 12 by approximately 37 mm, thus requiring an axial component of scan plate movement of 37 mm.

Figure 4:
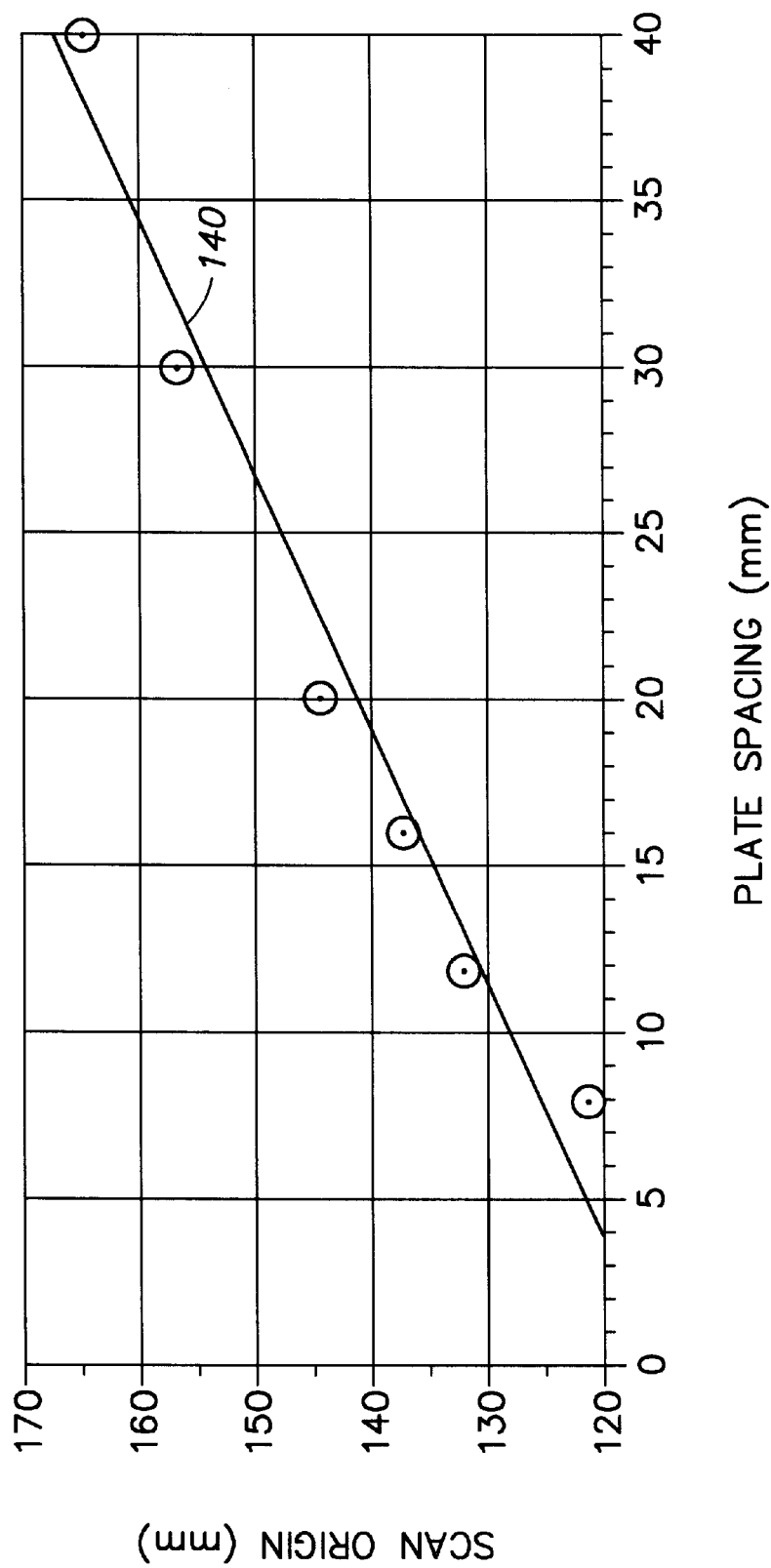
FIG. 4 is a graph of scan origin location as a function of scan plate spacing.

A graph of scan origin position in millimeters as a function of plate spacing in millimeters for one example of scan plate geometry is shown in FIG. 4. A line 140 represents the shift in scan origin 120 as a function of scan plate spacing for a given scan plate geometry. It will be understood that the graph of FIG. 4 represents a particular scan plate geometry and that other scan plate geometries would be represented by different lines.

A second example of an electrostatic scanner for use in the ion beam apparatus of FIG. 1 is described with reference to FIGS. 5 and 6. An electrostatic scanner 148 includes scan plates 150 and 152 spaced apart by a gap 154. Scan plates 150 and 152, which correspond to scan elements 40 and 42 shown in FIG. 1, have a spacing S that diverges in the downstream direction of ion beam 12. FIG. 5 represents a configuration suitable for a relatively high energy ion beam, and FIG. 6 represents a configuration suitable for a relatively low energy ion beam. For the low energy ion beam, as shown in FIG. 6, the spacing S between scan plates 150 and 152 is increased, and the downstream portions of scan plates 150 and 152 are rotated away from ion beam 12. The increase in spacing S combined with rotation of scan plates 150 and 152 has the combined effect of increasing beam acceptance and controlling scan origin shift. In particular, the rotation of scan plates 150 and 152 may be selected for a given change in spacing S to achieve a fixed position of the scan origin of the beam envelope.

Figure 7:
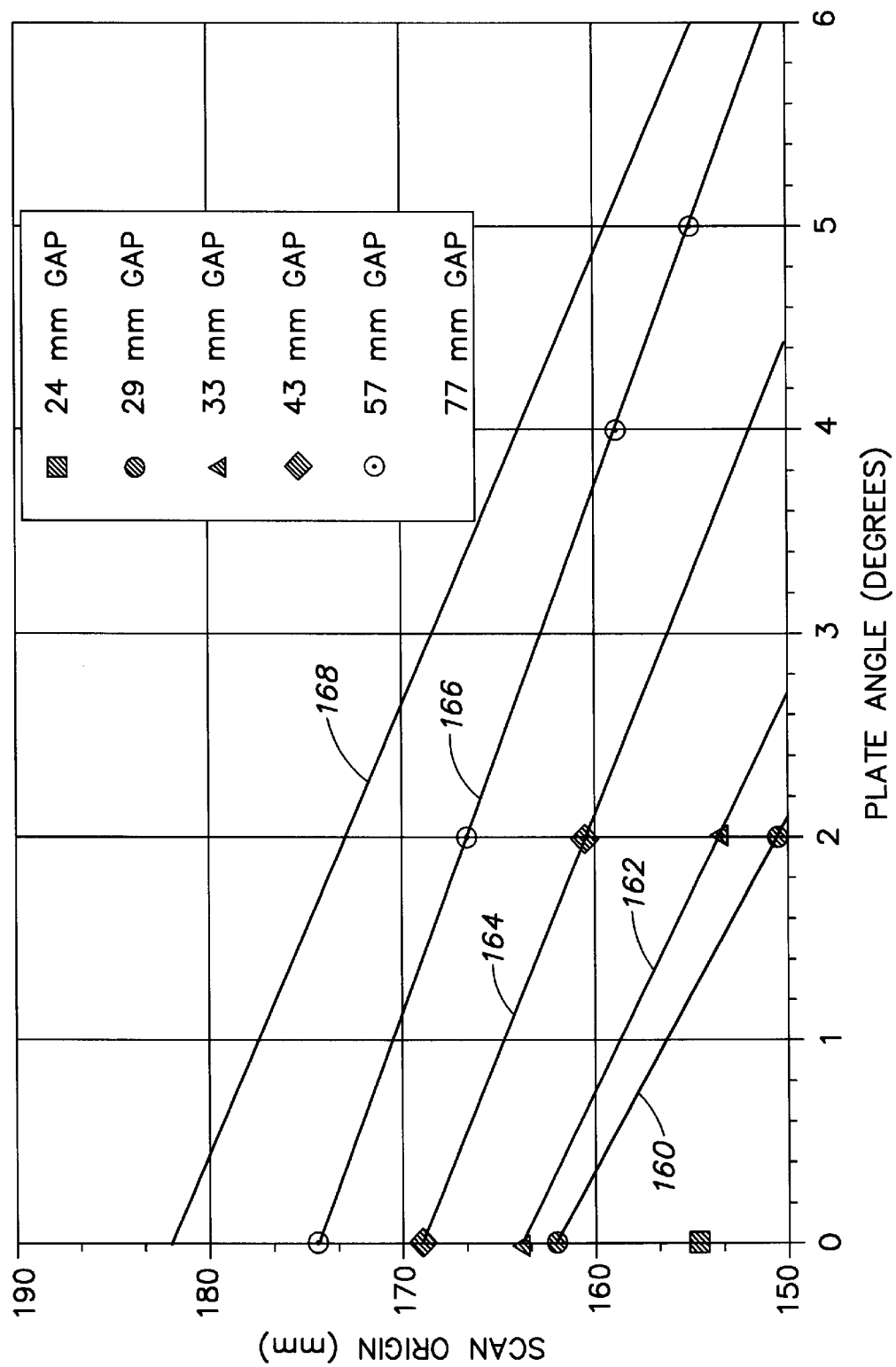
FIG. 7 is a graph of scan origin location as a function of plate angle for different scan plate spacings.

A graph of scan origin location as a function of scan plate angle for different scan plate spacings is shown in FIG. 7. In particular, line 160 represents scan origin position as a function of scan plate angle for a spacing between scan plates 150 and 152 of 29 mm. Similarly, lines 162, 164, 166 and 168 represent scan origin position as a function of scan plate angle for plate spacings of 33 mm, 43 mm, 57 mm and 77 mm, respectively. It will be understood that the graph of FIG. 7 represents a particular scan plate geometry and other scan plate geometries would be represented by different sets of lines.

The control of scan element position as described above may be manual or automatic. When control is automatic, system controller 64 (FIG. 1) determines the required positions of scan elements 40 and 42 based on the user-selected parameters of the ion beam. Such parameters may include ion beam species and energy. The system controller 64 determines the required positions of scan elements 40 and 42 based on the selected beam parameters and provides position control signals to scan element positioners 60 and 62. Scan element positioners 60 and 62 in turn adjust the positions of scan elements 40 and 42. In a manual mode, the user provides desired scan element positions to system controller 64, and system controller 64 provides corresponding position control signals to scan element positioners 60 and 62. It will be understood that the positions of scan elements 40 and 42 are typically adjusted during the setup period for an implant with ion beam generator 10 turned off.

Figure 8:
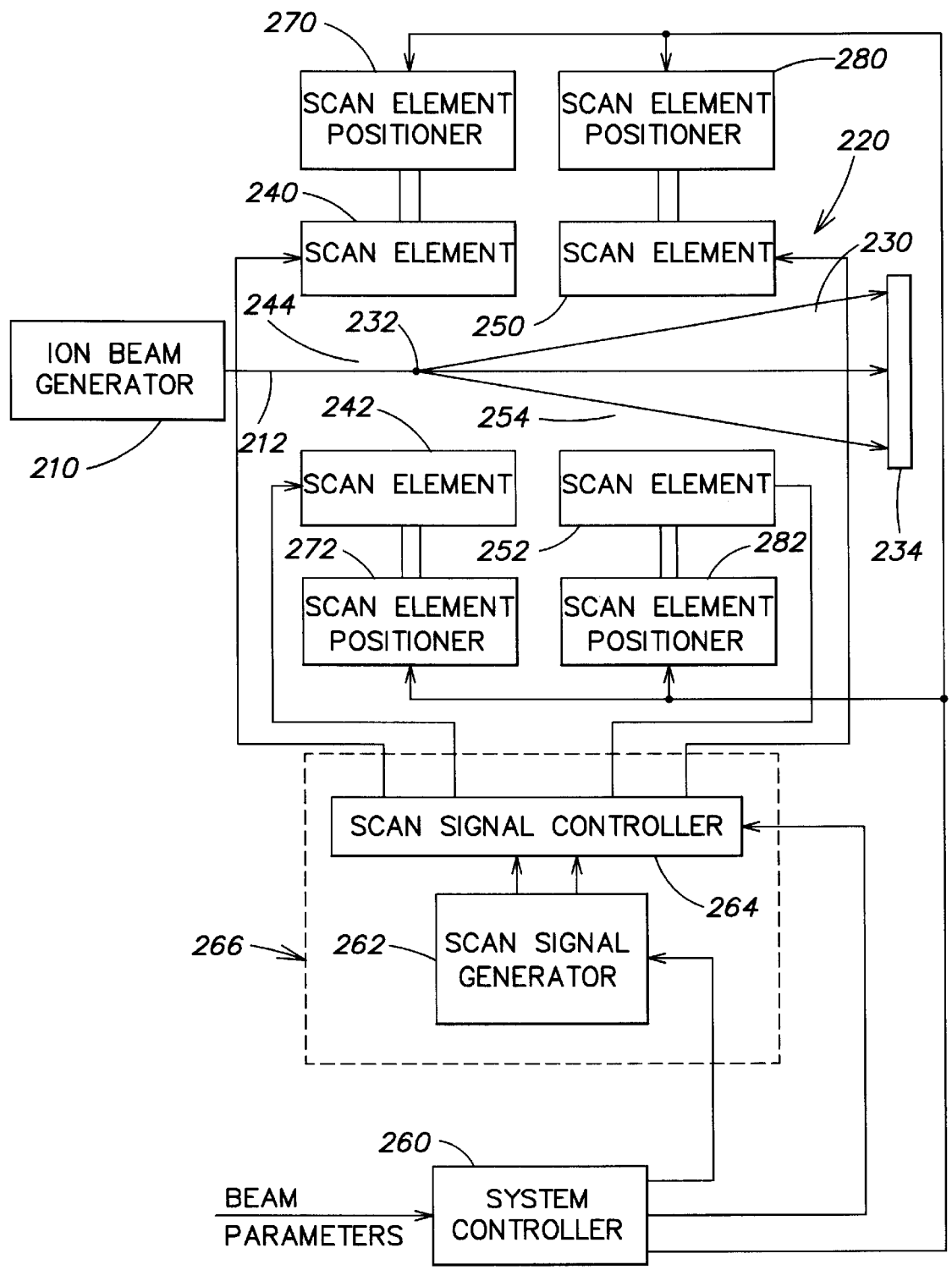
FIG. 8 is a block diagram of beam scanning apparatus in accordance with a second embodiment of the invention.

A simplified block diagram of an ion beam system in accordance with a second embodiment of the invention is shown in FIG. 8. An ion beam generator 210 generates an ion beam of a desired species, accelerates ions in the ion beam to desired energies, performs mass/energy analysis of the ion beam to remove energy and mass contaminants, and supplies an energetic ion beam 212. A scanner 220 deflects the ion beam 212 to produce a scanned ion beam having a beam envelope 230 with a scan origin 232. Scanner 220 is part of a beam scanning apparatus as described below. A semiconductor wafer 234 or other workpiece is positioned in the path of ion beam 212.

Scanner 220 includes a first set of scan elements 240 and 242, and a second set of scan elements 250 and 252. Scan elements 240 and 242 are spaced apart and define a gap 244 through which ion beam 212 is directed. Scan elements 250 and 252 are spaced apart and define a gap 254 through which ion beam 212 is directed. Scan elements 240 and 242 and scan elements 250 and 252 are positioned for deflecting ion beam 212 in one dimension, as distinguished from sets of scan plates which are orthogonally positioned with respect to the ion beam and which perform two-dimensional scanning of an ion beam. It will be understood that scanner 220 may include more than two sets of scan plates. In one embodiment, scanner 220 is an electrostatic scanner, and scan elements 240, 242, 250, 252 are electrostatic scan plates. As previously noted, the scan plates in each set are horizontally spaced for horizontal beam scanning. In another embodiment, scanner 220 is a magnetic scanner, and scan elements 240 and 242 are magnetic polepieces of a first electromagnet, and scan elements 250 and 252 are magnetic polepieces of a second electromagnet. As previously noted, the magnetic polepieces of each electromagnet are vertically spaced for horizontal beam scanning.

The beam scanning apparatus of FIG. 8 further includes a system controller 260, a scan signal generator 262 and a scan signal controller 264. System controller 260 receives beam parameters selected by a user and provides control signals to scan signal generator 262 and scan signal controller 264. Scan signal generator 262 generates scan signals, which may be scan voltages in the case of an electrostatic scanner or a scan current in the case of a magnetic scanner. Scan signal controller 264 provides scan signals to first scan elements 240 and 242 and second scan elements 250 and 252. Scan signal generator 262 and scan signal controller 264 constitute a scan generator 266. The scan signals provided to first scan elements 240 and 242 and to second scan elements 250 and 252 are individually controlled. Thus, scan signal controller 264 may vary the scan signals provided to first scan elements 240 and 242 and to second scan elements 250 and 252 between zero and maximum values to achieve a desired result. In one example, the ratio of the scan signals supplied to scan elements 240 and 242 and to scan elements 250 and 252 may be adjusted so as to control the position of scan origin 232. In another example, one set of scan elements, such as scan elements 240 and 242, may be grounded electrically when low energy ion beams are being utilized.

The beam scanning apparatus of FIG. 8 may ether include a scan element positioner 270 connected to scan element 240, a scan element positioner 272 connected to scan element 242, a scan element positioner 280 connected to scan element 250 and a scan element positioner 282 connected to scan element 252. The scan element positioners 270, 272, 280 and 282 adjust 15 the positions of the respective scan elements under control of system controller 260. System controller 260 provides position control signals as a function of beam parameters such as species and energy. Scan element positioners 270 and 272 may move scan elements 240 and 242, respectively, with respect to ion beam 212 so as to adjust gap 244. Scan element positioners 280 and 282 may move scan elements 250 and 252, respectively, with respect to ion beam 212 so as to adjust gap 254.

A first example of an electrostatic scanner for use in the ion beam apparatus of FIG. 8 is described with reference to FIG. 9. An electrostatic scanner 300 includes a first set of scan plates 310 and 312 spaced apart by a gap 314 and a second set of scan plates 320 and 322 spaced apart by a gap 324. Scan plates 310 and 320 are positioned on one side of ion beam 212 and are electrically isolated from each other. Scan plates 312 and 322 are positioned on the opposite side of ion beam 212 and are electrically isolated from each other. Scan plates 310 and 312 and scan plates 320 and 322 have a spacing that diverges in the downstream direction and produce electric fields suitable for scanning ion beam 212 in one dimension in response to scan voltages. A fan-shaped beam envelope 330 having a scan origin 332 increases in width in the downstream direction through scanner 300.

Scanner 300 may be controlled by adjusting the positions of the scan plates in one or both sets of scan plates, by adjusting the relative scan voltages applied to the sets of scan plates, or both. For example, the spacing between scan plates 310 and 312 may be increased, and the spacing between scan plates 320 and 322 may be increased to accommodate low energy beams. Furthermore, the ratio of the scan voltages applied to scan plates 310 and 312 and scan plates 320 and 322 may be adjusted to control the position of scan origin 332 as the spacing between scan plates is adjusted. In particular, the scan voltages applied to upstream scan plates 310 and 312 are increased relative to the scan voltages applied to downstream scan plates 320 and 322 as the spacing between scan plates is increased. It will be understood that a wide dynamic range and a high degree of flexibility can be obtained by adjusting the positions of the scan plates in one or both sets of scan plates and by adjusting the relative scan voltages applied to the sets of scan plates. Adjustment of scan plate position and adjustment of relative scan plate voltages may be utilized separately or in combination.

A second example of an electrostatic scanner for use in the ion beam apparatus of FIG. 8 is described with reference to FIG. 10. An electrostatic scanner 400 includes a first set of scan plates 410 and 412 separated by a gap 414, a second set of scan plates 420 and 422 separated by a gap 422 and a third set of scan plates 430 and 432 separated by a gap 434. Scan plates 410, 420 and 430 are positioned on one side of ion beam 212, and scan plates 412,422 and 432 are positioned on the opposite side of ion beam 212. The scan plates have a spacing that diverges in the downstream direction and produce electric fields suitable for scanning ion beam 212 in one dimension. A fan-shaped beam envelope 440 having a scan origin 442 increases in width in the downstream direction. As described above, the spacing between the scan plates in one or both sets of scan plates may be adjusted, and the relative scan voltages applied to the sets of scan plates may be adjusted to achieve a desired operation.

For high energy operation, the scan plates are positioned with small spacing, and all scan plates of the same polarity are connected together. For low energy operation, the spacing between scan plates is increased, allowing a relatively large diameter ion beam to pass. Scan plates 410 and 412 and scan plates 430 and 434 are electrically grounded (zero scan voltage), and only scan plates 420 and 422 are used. By appropriate choice of scan plate geometry, the scan origin position for high energy and low energy operation may be the same. That is, the scan origin position for scan plates 420 and 422 with a relatively large spacing may be the same as the scan origin position for scan plates 410, 412, 420, 422, 430 and 432 with a relatively small spacing.

It may be observed that the effective length of scanner 400 is reduced when one or more sets of scan plates is grounded. This reduction in effective length of the scanner serves to lessen the space charge forces that reduce beam transmission to the wafer. A preferred embodiment uses only electrically grounded or negatively biased scan plates for positive ion beam scanning at low energy. This minimizes space charge forces on the beam and provides, with large plate spacing, high beam transmission to the wafer. Such space charge forces have the undesired effect of increasing the beam size, which in turn can reduce the transmission of the beam to the wafer.

While there have been shown and described what are at present considered the preferred embodiments of the present invention, it will be obvious to those skilled in the art that various changes and modifications may be made therein without departing from the scope of the invention as defined by the appended claims.

What is claimed is:

1. Apparatus for scanning a charged particle beam, comprising:
    scan elements spaced apart by a gap for passing a charged particle beam;
    a scan signal generator coupled to said scan elements for generating scan signals for scanning the charged particle beam in a scan pattern having a scan origin; and
    a position controller for positioning said scan elements based on at least one parameter of the charged particle beam.

2. Apparatus as defined in claim 1 wherein said scan elements comprise electrostatic scan plates for electrostatic deflection of the charged particle beam and wherein said scan signal generator comprises a scan voltage generator.

3. Apparatus as defined in claim 1 wherein said scan elements comprise magnetic polepieces and a magnet coil for energizing said magnetic polepieces, and wherein scan signal generator comprises a scan current generator for energizing said magnet coil.

4. Apparatus as defined in claim 1 wherein said position controller comprises means for positioning said scan elements to achieve a desired position of the scan origin for given parameter values of the charged particle beam.

5. Apparatus as defined in claim 1 wherein said position controller comprises means for positioning said scan elements to achieve a fixed position of the scan origin for different parameter values of the charged particle beam.

6. Apparatus as defined in claim 1 wherein said position controller comprises means for positioning said scan elements to achieve a desired position of the scan origin as the energy of the charged particle beam changes.

7. Apparatus as defined in claim 2 wherein said position controller comprises means for moving said scan plates upstream with respect to the charged particle beam as the spacing between the scan plates is increased.

8. Apparatus as defined in claim 2 wherein said position controller comprises means for moving said scan plates upstream along linear paths at angles with respect to an axis of the charged particle beam.

9. Apparatus as defined in claim 2 wherein said position controller comprises means for rotating said scan plates as the spacing between said scan plates is changed.

10. Apparatus as defined in claim 2 wherein said position controller comprises means for translating said scan plates along linear paths disposed at opposite angles with respect to an axis of the charged particle beam.

11. Apparatus as defined in claim 1 wherein said position controller comprises means for automatically positioning said scan elements based on the parameter of the charged particle beam.

12. Apparatus as defined in claim 2 wherein said position controller comprises means for moving said scan plates to two or more discrete positions based on the energy of the charged particle beam.

13. Apparatus as defined in claim 2 wherein said position controller comprises means for moving said scan plates along a continuous range of positions based on the energy of the charged particle beam.

14. Apparatus for scanning a charged particle beam, comprising:
    first scan elements spaced apart by a first gap for passing a charged particle beam;
    second scan elements spaced apart by a second gap for passing the charged particle beam;
    a scan signal generator coupled to said scan elements for generating scan signals for scanning the charged particle beam in a scan pattern having a scan origin; and
    a scan signal controller for controlling the scan signals supplied from said scan signal generator to said first scan elements and said second scan elements based on at least one parameter of the charged particle beam.

15. Apparatus as defined in claim 14 wherein said first scan elements and said second scan elements each comprise scan plates for electrostatic deflection of the charged particle beam and wherein said scan signal generator comprises a scan voltage generator.

16. Apparatus as defined in claim 14 wherein said first scan elements and said second scan elements each comprise magnetic polepieces and a magnet coil for energizing said magnetic polepieces, and wherein said scan signal generator comprises a scan current generator for energizing said magnet coil.

17. Apparatus as defined in claim 14 wherein scan signal controller comprises means for controlling the scan signals supplied to said first scan elements and said second scan elements to achieve a desired position of the scan origin for given parameter values of the charged particle beam.

18. Apparatus as defined in claim 14 wherein said scan signal controller comprises means for controlling the scan signals supplied to said first scan elements and said second scan elements to achieve a fixed position of the scan origin for different parameter values of the charged particle beam.

19. Apparatus as defined in claim 14 wherein said scan signal controller comprises means for controlling the scan signals supplied to said first scan elements and said second scan elements to achieve a desired position of the scan origin as the energy of the charged particle beam changes.

20. Apparatus as defined in claim 14 wherein said scan signal controller comprises means for controlling the scan signals supplied to said first scan elements and said second scan elements to change the effective length of said first scan elements and said second scan elements.

21. Apparatus as defined in claim 14 wherein said scan signal controller comprises means for adjusting the ratio of scan signals supplied to said first scan elements and said second scan elements.

22. Apparatus as defined in claim 14 further comprising a position controller for positioning one or both of said first scan elements and said second scan elements based on said at least one parameter of the charged particle beam.

23. Apparatus as defined in claim 14 wherein said scan signal controller comprises means for applying the scan signals to the first and second scan elements for scanning a high energy charged particle beam and means for applying the scan signals to the first scan plates and for grounding the second scan plates for scanning a low energy charged particle beam, wherein an effective length over which electric fields are applied to the charged particle beam is reduced for scanning a low energy beam.

24. Apparatus as defined in claim 23 wherein the charged particle beam comprises a positive ion beam and wherein the scan signal generator applies only negative voltages or ground to the first and second scan elements for scanning a low energy beam.

25. A method for scanning a charged particle beam, comprising the steps of:
    directing a charged particle beam between spaced-apart scan elements;
    energizing said scan elements for scanning the charged particle beam in a scan pattern having a scan origin; and
    s controlling positions of said scan elements based on at least one parameter of the charged particle beam.

26. A method as defined in claim 25 wherein the step of directing a charged particle beam comprises directing a charged particle beam between spaced-apart electrostatic scan plates and wherein the step of energizing said scan elements comprises coupling scan voltages to said scan plates.

27. A method as defined in claim 25 wherein the step of directing a charged particle beam comprises directing a charged particle beam between polepieces of a scan magnet and wherein the step of energizing said scan elements comprises coupling scan currents to a magnet coil of the scan magnet.

28. A method as defined in claim 25 wherein the step of positioning said scan elements comprises positioning said scan elements to achieve a fixed position of the scan origin for different parameter values of the charged particle beam.

29. A method as defined in claim 25 wherein the step of positioning said scan elements comprises positioning said scan elements to achieve a fixed position of the s can origin for different energies of the charged particle beam.

30. A method as defined in claim 26 wherein the step of positioning said scan elements comprises moving said scan plates upstream with respect to the charged particle beam and increasing the spacing between the scan plates.

31. A method as defined in claim 26 wherein the step of positioning said scan elements comprises varying the gap between said scan plates and rotating said scan plates.

32. A method as defined in claim 25 wherein the step of positioning said scan elements comprises positioning said scan elements to achieve a desired position of the scan origin for given parameter values of the charged particle beam.

33. A method as defined in claim 26 wherein the step of positioning said scan elements comprises moving said scan plates to two or more discrete positions based on the energy of the charged particle beam.

34. A method as defined in claim 26 wherein the step of positioning said scan elements comprises moving said scan plates along a continuous range of positions based on the energy of the charged particle beam.

35. A method for scanning a charged particle beam, comprising the steps of:

directing a charged particle beam between spaced-apart first scan elements and spaced-apart second scan elements;

applying scan signals to said first scan elements and said second scan elements for scanning the charged particle beam in a scan pattern having a scan origin; and controlling the scan signals applied to said first scan elements and said second scan elements based on at least one parameter of the charged particle beam.

36. A method as defined in claim 35 wherein the step of controlling the scan signals comprises controlling the scan signals applied to said first scan elements and said second scan elements to achieve a desired position of the scan origin for given parameter values of the charged particle beam.

37. A method as defined in claim 35 further comprising the step of controlling positions of one or both of said first scan elements and said second scan elements based on said at least one parameter of the charged particle beam.

38. Apparatus for scanning an ion beam, comprising:

two or more pairs of scan plates for scanning the ion beam; and a scan generator for applying scan voltages to said two or more pairs of scan plates for scanning a high energy ion beam and for applying scan voltages to a subset of said two or more sets of scan plates for scanning a low energy ion beam, wherein unused scan plates are electrically grounded and wherein an effective length over which electric fields are applied to the ion beam is reduced for scanning a low energy beam.

39. Apparatus as defined in claim 38 wherein the ion beam is a positive ion beam and wherein said scan generator applies only negative voltages or ground to said two or more pairs of scan plates for scanning a low energy ion beam.

40. Apparatus as defined in claim 38 further comprising a position controller for positioning said two or more pairs of scan plates based on the energy of the ion beam.

* * * * *